US012765162B2

(12) United States Patent
Hamade

(10) Patent No.: US 12,765,162 B2
(45) Date of Patent: Oct. 13, 2026

(54) ELECTRO-OPTICAL DEVICE AND ELECTRONIC APPARATUS

(71) Applicant: SEIKO EPSON CORPORATION, Tokyo (JP)

(72) Inventor: Yuiga Hamade, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 372 days.

(21) Appl. No.: 18/616,522

(22) Filed: Mar. 26, 2024

(65) Prior Publication Data

US 2024/0334726 A1 Oct. 3, 2024

(30) Foreign Application Priority Data

Mar. 27, 2023 (JP) ................................ 2023-049534

(51) Int. Cl.

*H10K 59/35* (2023.01)
*H10K 50/125* (2023.01)
*H10K 50/82* (2023.01)
*H10K 50/856* (2023.01)
*H10K 59/80* (2023.01)
(Continued)

(52) U.S. Cl.

CPC ........... *H10K 50/125* (2023.02); *H10K 50/82* (2023.02); *H10K 50/856* (2023.02); *H10K 59/352* (2023.02); *H10K 59/8052* (2023.02); *H10K 2101/10* (2023.02); *H10K 2101/27* (2023.02)

(58) Field of Classification Search

CPC ...... H10K 50/11; H10K 50/125; H10K 50/13; H10K 50/82; H10K 50/856; H10K 59/1213; H10K 59/122; H10K 59/123; H10K 59/13; H10K 59/1315; H10K 59/35; H10K 59/352; H10K 59/8052; H10K 59/876; H10K 2101/10; H10K 2101/27

See application file for complete search history.

(56) References Cited

U.S. PATENT DOCUMENTS

2019/0035862 A1 1/2019 Koshihara
2022/0309267 A1* 9/2022 Kim .................. G06V 40/1318
2024/0431148 A1* 12/2024 Yanagisawa ........... H05B 33/12

FOREIGN PATENT DOCUMENTS

JP 2019-029188 A 2/2019

* cited by examiner

*Primary Examiner* — Hoai V Pham
(74) *Attorney, Agent, or Firm* — Oliff PLC

(57) ABSTRACT

An electro-optical device includes first light-emitting element including counter electrode, first pixel electrode, and first light-emitting layer, and emitting light in first wavelength region, second light-emitting element including the counter electrode, second pixel electrode, and second light-emitting layer, and emitting light in second wavelength region, first reflection layer, first optical adjustment layer configured to adjust a first optical distance between the first reflection layer and the counter electrode, a second reflection layer, and a second optical adjustment layer configured to adjust a second optical distance between the second reflection layer and the counter electrode, wherein the light, in the first wavelength region resonates between the first reflection layer and the counter electrode, the light, in the second wavelength region resonates between the second reflection layer and the counter electrode, and a material forming the first light-emitting layer and a material forming the second light-emitting layer are different from each other.

9 Claims, 6 Drawing Sheets

(51) Int. Cl.

| | |
|---|---|
| *H10K 101/00* | (2023.01) |
| *H10K 101/10* | (2023.01) |

ELECTRO-OPTICAL DEVICE AND ELECTRONIC APPARATUS

The present application is based on, and claims priority from JP Application Serial Number 2023-049534, filed Mar. 27, 2023, the disclosure of which is hereby incorporated by reference herein in its entirety.

BACKGROUND

1. Technical Field

The present disclosure relates to an electro-optical device and an electronic apparatus.

2. Related Art

Electro-optical devices such as liquid crystal display devices and organic electroluminescent display devices are known. An electro-optical device described in JP 2019-029188 A is known as an example of such devices.

The electro-optical device disclosed in JP 2019-029188 A includes a light-emitting element and a reflection layer. The light-emitting element and the reflection layer are provided for each sub-pixel. The light-emitting element includes a pixel electrode, a light emission function layer, and a counter electrode. A distance adjustment layer for adjusting an optical distance is provided between the reflection layer and the counter electrode. In addition, in the electro-optical device, the light emission function layer is common to a plurality of the sub-pixels and emits white light.

Further, in the electro-optical device, an optical resonant structure is formed by the reflection layer and the counter electrode. Therefore, light emitted from the light emission function layer is repeatedly reflected between the reflection layer and the counter electrode, and intensity of light having a wavelength corresponding to an optical distance is increased for each sub-pixel.

Since the optical resonant structure is provided, light efficiency can be increased and color purity can be improved. However, in the electro-optical device disclosed in JP 2019-029188 A, since the light emission function layer is common to the plurality of sub-pixels, a part of white light emitted from the light emission function layer is discarded as unused light. For example, in a sub-pixel that emits light in a red wavelength region, light in a green wavelength region and light in a blue wavelength region are not used. Therefore, it is desired to improve light extraction efficiency in an electro-optical device having an optical resonant structure.

SUMMARY

In order to solve the above-described problems, an electro-optical device according to a preferred aspect of the present disclosure includes a first light-emitting element including a counter electrode having a semi-transmissive property, a first pixel electrode having translucency, and a first light emission function layer including a first light-emitting layer, disposed between the first pixel electrode and the counter electrode, and being in contact with the first pixel electrode and the counter electrode, and configured to emit light in a first wavelength region, a second light-emitting element including the counter electrode, a second pixel electrode having translucency, and a second light emission function layer including a second light-emitting layer, disposed between the second pixel electrode and the counter electrode, and being in contact with the second pixel electrode and the counter electrode, and configured to emit light in the second wavelength region different from the first wavelength region, a first reflection layer, a first optical adjustment layer disposed between the first reflection layer and the first light-emitting element and configured to adjust a first optical distance between the first reflection layer and the counter electrode, a second reflection layer, and a second optical adjustment layer having a thickness different from a thickness of the first optical adjustment layer, disposed between the second reflection layer and the second light-emitting element, and configured to adjust a second optical distance between the second reflection layer and the counter electrode, wherein the light, in the first wavelength region, emitted by the first light-emitting element resonates between the first reflection layer and the counter electrode, and is emitted from the counter electrode, the light, in the second wavelength region, emitted by the second light-emitting element resonates between the second reflection layer and the counter electrode, and is emitted from the counter electrode, and a material forming the first light-emitting layer and a material forming the second light-emitting layer are different from each other.

DESCRIPTION OF EMBODIMENTS

Figure 1:
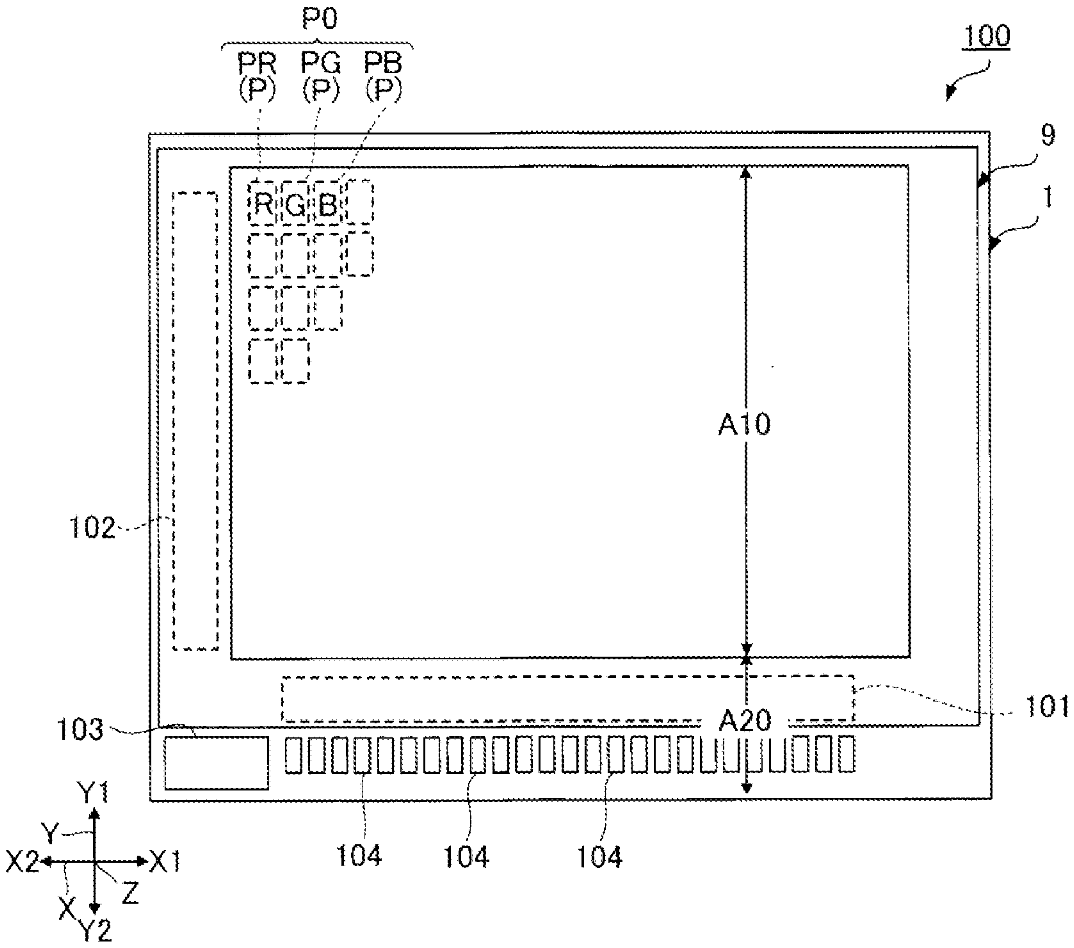
FIG. 1 is a plan view illustrating an electro-optical device in an embodiment.

Preferred embodiments according to the present disclosure are described below with reference to the attached drawings. In addition, in the drawings, dimensions and scales of each part are appropriately made different from actual ones, and some parts are illustrated schematically to make them easier to understand. Further, the scope of the present disclosure is not limited to these forms, unless otherwise stated in the following description to limit the present disclosure.

Further, "electrical coupling" between an element α and an element β includes not only a configuration where the element α and the element β are electrically coupled by being directly joined to each other, but also a configuration where the element and the element β are electrically coupled indirectly through another conductive material. Further, "the element β at the element α" includes not only a configuration where the element α and the element β directly contact each other, but also a configuration where the element α and the element β indirectly contact each other via another element. In addition, when "the element α and the element β are equal to each other", it is sufficient that the element α and the element β are substantially equal to each other, and a range of a manufacturing error is included.

1. Embodiment

1A. Basic Configuration of Electro-Optical Device

FIG. 1 is a plan view illustrating an electro-optical device 100 in an embodiment. An X-axis, a Y-axis, and a Z-axis that are orthogonal to one another are used below as appropriate for convenience of description. In addition, one direction along the X-axis is referred to as an X1 direction, and a direction opposite to the X1 direction is referred to as an X2 direction. Similarly, one direction along the Y-axis is referred to as a Y1 direction, and a direction opposite to the Y1 direction is referred to as a Y2 direction. One direction along the Z-axis is referred to as a Z1 direction, and a direction opposite to the Z1 direction is referred to as a Z2 direction. Viewing from the Z1 direction or the Z2 direction is referred to as "plan view". Further, "optical transparency" indicates transmissivity with respect to visible light, and may indicate a transmittance of visible light of 50% or greater. Further, "light reflectivity" refers to reflectivity to visible light, and means that a reflectance of visible light may be greater than or equal to 50%.

Further, in the following embodiment, a pixel electrode 23B corresponds to a "first pixel electrode". The pixel electrode 23G corresponds to the "second pixel electrode". The pixel electrode 23R corresponds to the "third pixel electrode". The light-emitting layer 244B corresponds to the "first light-emitting layer". The light-emitting layer 244G corresponds to the "second light-emitting layer". The light-emitting layer 244R corresponds to the "third light-emitting layer". The light emission function layer 200B corresponds to the "first light emission function layer". The light emission function layer 200G corresponds to the "second light emission function layer". The light emission function layer 200R corresponds to the "third light emission function layer". The light-emitting element 20B corresponds to the "first light-emitting element". The light-emitting element 20G corresponds to the "second light-emitting element". The light-emitting element 20R corresponds to the "third light-emitting element". The reflection layer 21B corresponds to the "first reflection layer". The reflection layer 21G corresponds to the "second reflection layer". The reflection layer 21R corresponds to the "third reflection layer". The optical distance LB corresponds to the "first optical distance". The optical distance LG corresponds to the "second optical distance". The optical distance LR corresponds to the "third optical distance". An optical adjustment layer 220B corresponds to a "first optical adjustment layer". An optical adjustment layer 220G corresponds to a "second optical adjustment layer". An optical adjustment layer 220R corresponds to a "third optical adjustment layer". A light-emitting region AB corresponds to a "first light-emitting region". A light-emitting region AG corresponds to a "second light-emitting region". A light-emitting region AR corresponds to a "third light-emitting region".

The electro-optical device 100 illustrated in FIG. 1 is, for example, an organic electroluminescence (EL) device that displays full color images. Note that the images include those only displaying text information. The electro-optical device 100 is suitably used as a micro display that displays an image in a head-mounted display, for example.

The electro-optical device 100 includes a display region A10 and a peripheral region A20. The display region A10 is a region where images are displayed. A shape of the display region A10 in plan view is substantially rectangular, but may be a different shape. The peripheral region A20 is a frame-shaped region that is provided outside the display region A10, and surrounds the display region A10 in plan view.

The display region A10 includes a plurality of pixels P0. Each pixel P0 is a minimum unit in displaying an image. The plurality of sub-pixels P0 are disposed in a matrix along the X-axis and the Y-axis, for example. Each pixel P0 includes a sub-pixel PB, a sub-pixel PG, and a sub-pixel PR. The sub-pixel PR emits light in a red wavelength region. The sub-pixel PG emits light in a green wavelength region. The sub-pixel PB emits light in a blue wavelength region. The red wavelength region is an example of a "third wavelength region", is greater than 580 nm, and equal to or less than 700 nm. The green wavelength region is an example of a "second wavelength region", and is equal to or greater than 500 nm, and equal to or less than 580 nm. The blue wavelength region is an example of a "first wavelength region", and is equal to or greater than 400 nm and less than 500 nm.

In the following, when the sub-pixel PR, the sub-pixel PG, and the sub-pixel PB are not distinguished from each other, these sub-pixels are each expressed as a sub-pixel P. The sub-pixel P is a component constituting the pixel P0. The sub-pixel P is a minimum unit of an image to be displayed. One pixel P0 of a color image is expressed by the sub-pixel PR, the sub-pixel PG, and the sub-pixel PB. The sub-pixel P is independently controlled from other sub-pixels P. In the embodiment, an array of the sub-pixels P is a stripe array.

In addition, in the following, "R" is added to ends of reference numerals of elements related to the sub-pixel PR, "G" is added to ends of reference numerals of elements related to the sub-pixel PG, and "B" is added to ends of reference numerals of elements related to the sub-pixel PB. Note that "B", "G", and "R" at the ends of the reference numerals are omitted when there is no distinction for respective emission colors.

As illustrated in FIG. 1, the electro-optical device 100 includes an element substrate 1 and a transmissive substrate 9. The electro-optical device 100 has a so-called top emission structure. The electro-optical device 100 emits light from the transmissive substrate 9.

In the peripheral region A20, a data line driving circuit 101, a scanning line driving circuit 102, a control circuit 103, and a plurality of external terminals 104. The data line driving circuit 101 and the scanning line driving circuit 102 control driving of each unit included in each sub-pixel P. Image data is supplied to the control circuit 103 from an upper circuit (not illustrated). The control circuit 103 supplies various signals based on the image data to the data line driving circuit 101 and the scanning line driving circuit 102, to control displaying of an image. Although not illustrated, the external terminals 104 are coupled to a flexible printed circuit (FPC) board or the like for electrical coupling to the upper circuit. Note that a power supply circuit (not illustrated) is electrically coupled to the electro-optical device 100.

1B. Electrical Configuration of Electro-Optical Device

Figure 2:
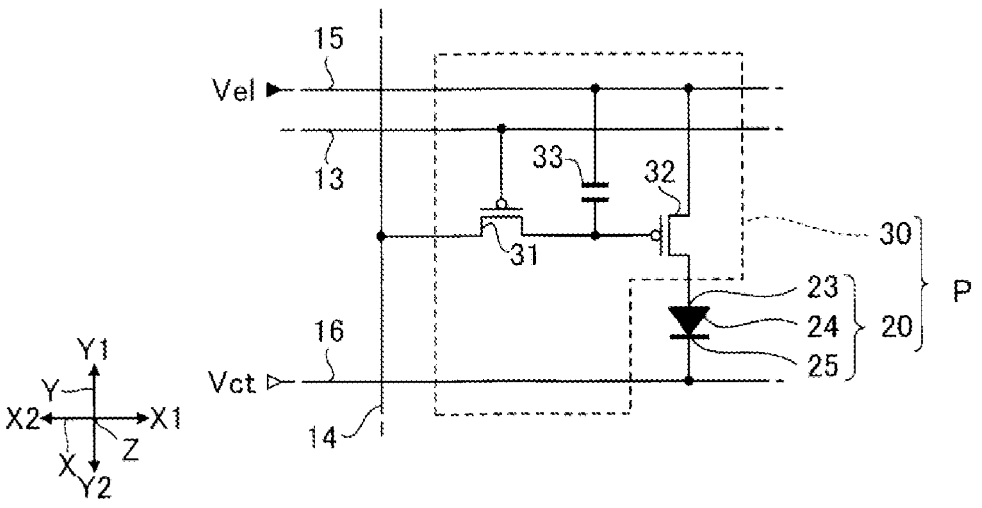
FIG. 2 is an equivalent circuit diagram of a sub-pixel in FIG. 1.

FIG. 2 is an equivalent circuit diagram of the sub-pixel P illustrated in FIG. 1. The electro-optical device 100 includes a plurality of scanning lines 13 and a plurality of data lines 14. In FIG. 2, one scanning line 13 and one data line 14 corresponding to one sub-pixel P are illustrated. The scanning lines 13 extend along the X-axis, and the data lines 14 extend along the Y-axis. Note that although not illustrated, the plurality of scanning lines 13 and the plurality of data lines 14 are arrayed in a lattice pattern. Further, each scanning line 13 is coupled to the scanning line driving circuit 102 illustrated in FIG. 1, and each data line 14 is coupled to the data line driving circuit 101 illustrated in FIG. 1.

As illustrated in FIG. 2, the sub-pixel P includes a light-emitting element 20 and a driving circuit 30. The light-emitting element 20 is constituted by an organic light-emitting diode (OLED). The light-emitting element 20 includes a pixel electrode 23, a counter electrode 25, and an organic layer 24. The pixel electrode 23 is provided for each sub-pixel P, and functions as an anode. The counter electrode 25 is common to the plurality of sub-pixels P, and functions as a cathode. The organic layer 24 is disposed between the pixel electrode 23 and the counter electrode 25. In the light-emitting element 20, by holes supplied from the pixel electrode 23, and electrons supplied from the counter electrode 25 being recombined in the organic layer 24, the organic layer 24 generates light. A power supplying line 16 is electrically coupled to the counter electrode 25. A potential Vct on a low potential side is supplied from the power supply circuit (not illustrated) to the power supplying line 16. The pixel electrode 23 can be set to be independent from and mutually different from the other pixel electrodes 23.

The driving circuit 30 is a pixel circuit that controls driving of the light-emitting element 20, and controls an amount of current supplied to the pixel electrode 23. The driving circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and another is electrically coupled to a gate of the driving transistor 32. Further, one of a source and a drain of the driving transistor 32 is electrically coupled to a power supplying line 15, and another is electrically coupled to the pixel electrode 23. Note that a potential Vel on a high potential side is supplied from the power supply circuit (not illustrated) to the power supplying line 15. Further, one electrode of the retention capacitor 33 is coupled to the gate of the driving transistor 32, and another electrode is coupled to the power supplying line 15.

When the scanning line 13 is selected by activating a scanning signal by the scanning line driving circuit 102, the switching transistor 31 provided at the selected sub-pixel P is turned on. Then, a data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the light-emitting element 20. Then, the light-emitting element 20 emits light at a luminance corresponding to a magnitude of the current supplied from the driving transistor 32. Further, when the scanning line driving circuit 102 releases the selection of the scanning line 13 and the switching transistor 31 is turned off, the potential of the gate of the driving transistor 32 is held by the retention capacitor 33. Accordingly, the light-emitting element 20 can emit light even after the switching transistor 31 is turned off.

Note that the configuration of the driving circuit 30 described above is not limited to the illustrated configuration. For example, the driving circuit 30 may further include a transistor that controls electrical coupling between the pixel electrode 23 and the driving transistor 32.

1C. Planar Disposition in Pixel P0

Figure 3:
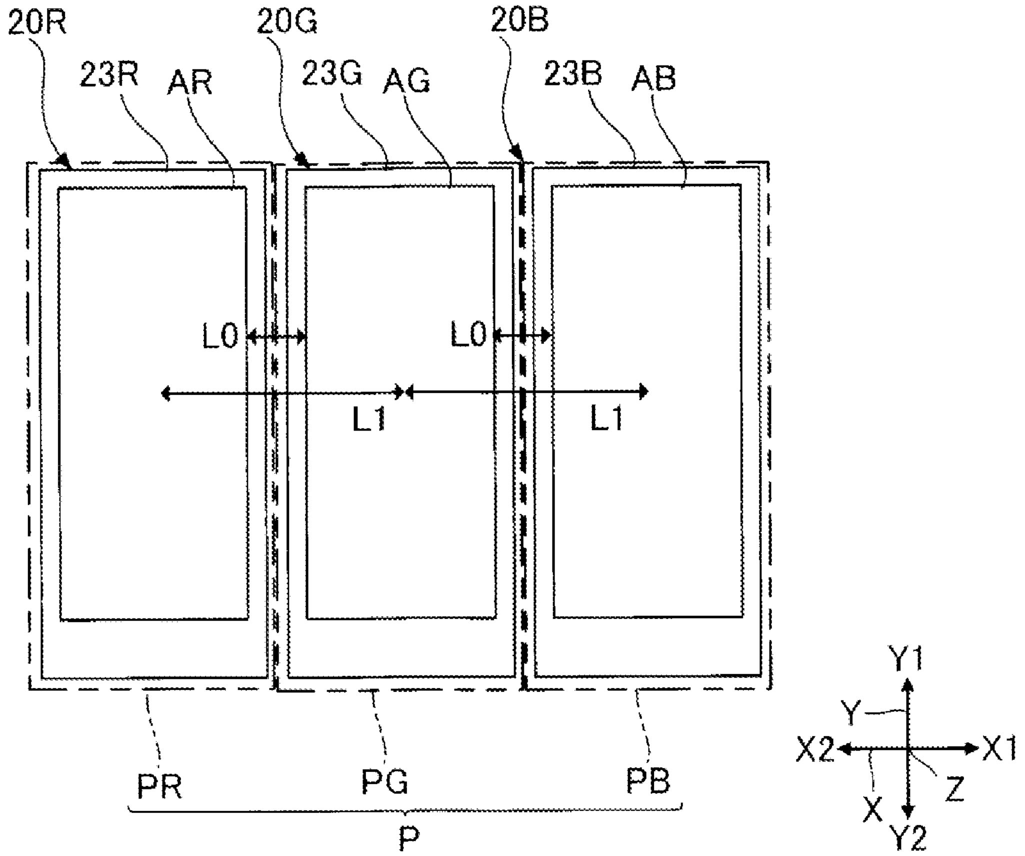
FIG. 3 is a planar schematic diagram of one pixel of the electro-optical device in FIG. 1.

FIG. 3 is a planar schematic diagram of one pixel P0 of the electro-optical device 100 illustrated in FIG. 1. In FIG. 3, elements of one pixel P0 are representatively illustrated.

As illustrated in FIG. 3, the element substrate 1 includes a set of a light-emitting element 20R, a light-emitting element 20G, and a light-emitting element 20B for each pixel P0. The light-emitting element 20R is the light-emitting element 20 provided at the sub-pixel PR. The light-emitting element 20G is the light-emitting element 20 provided at the sub-pixel PG. The light-emitting element 20B is the light-emitting element 20 provided at the sub-pixel PB.

The light-emitting element 20R is provided with a pixel electrode 23R. The pixel electrode 23R is the pixel electrode 23 provided at the sub-pixel PR. The light-emitting element 20G is provided with a pixel electrode 23G. The pixel electrode 23G is the pixel electrode 23 provided at the sub-pixel PG. The light-emitting element 20B is provided with a pixel electrode 23B. The pixel electrode 23B is the pixel electrode 23 provided at the sub-pixel PB.

The light-emitting element 20R includes a light-emitting region AR. From the light-emitting region AR, light in the red wavelength region is emitted. The light-emitting element 20G includes a light-emitting region AG. From the light-emitting region AG, light in the green wavelength region is emitted. The light-emitting element 20B includes a light-emitting region AB. From the light-emitting region AB, light in the blue wavelength region is emitted.

Distances L0 that are each a distance between two adjacent light-emitting regions A, are equal to each other in the illustrated example, but may be different from each other. For example, the distance L0 is a shortest distance between the light-emitting region AR and the light-emitting region AG. Further, the distance L0 is a shortest distance between the light-emitting region AG and the light-emitting region AB. In addition, pitches L1 of a plurality of light-emitting regions A, that is, center-to-center distances are equal to each other in the illustrated example, but may be different from each other.

Further, in the example illustrated in FIG. 3, a shape of each of the light-emitting region AR, the light-emitting region AG, and the light-emitting region AB in plan view is a quadrangle, but may be another polygon such as an octagon, or a circle. In addition, the shapes of the light-emitting region AR, the light-emitting region AG, and the light-emitting region AB in plan view may be different from each other or may be the same as each other.

1D. Cross-Sectional Structure at Pixel P0

Figure 4:
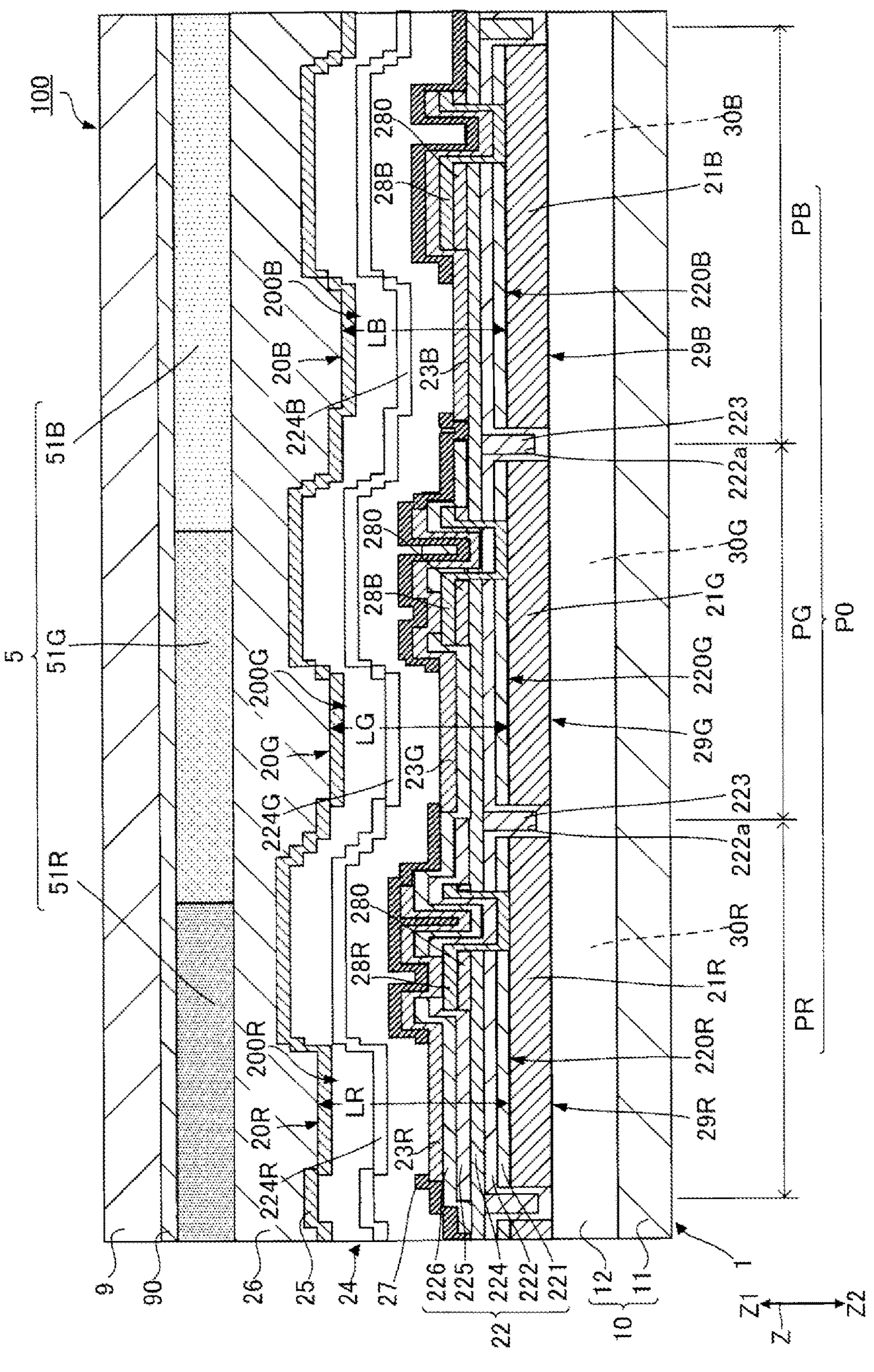
FIG. 4 is a diagram illustrating a cross-section of the electro-optical device in FIG. 1.

FIG. 4 is a cross-sectional view of the electro-optical device 100 in FIG. 1. Note that in FIG. 4, each element included in the sub-pixels PB, PG, and PR are illustrated in one cross section for convenience of description.

As illustrated in FIG. 4, the electro-optical device 100 includes the element substrate 1, an adhesive layer 90, and the transmissive substrate 9. The element substrate 1 includes a substrate 10, the reflection layer 21R, the reflection layer 21G, the reflection layer 21B, a stacked body 22, the pixel electrodes 23R, the pixel electrode 23G, the pixel electrode 23B, the organic layer 24, the counter electrode 25, a sealing layer 26, an element separation layer 27, and a colored layer 5.

The substrate 10 includes a flat plate-shaped base portion 11 and an inorganic insulating layer 12. The base portion 11 is, for example, formed of a silicon substrate. The inorganic insulating layer 12 includes a plurality of interlayer insulating films. Each interlayer insulating film contains an inorganic material containing silicon such as silicon oxide. The inorganic insulating layer 12 is provided with the driving circuit 30 described above. The driving circuit 30 provided at the sub-pixel PR is a driving circuit 30R, and controls an amount of current supplied to the pixel electrode 23R. The driving circuit 30 provided at the sub-pixel PG is a driving circuit 30G, and controls an amount of current supplied to the pixel electrode 23G. The driving circuit 30 provided at the sub-pixel PB is a driving circuit 30B, and controls an amount of current supplied to the pixel electrode 23B.

Note that a part of the driving circuit 30 may be formed at a part of the base portion 11. Further, various wiring lines and the like provided at the substrate 10 contain, for example, metal such as aluminum (Al) or a metal compound such as titanium nitride, and may each be single-layered or multi-layered.

At the substrate 10, the reflection layer 21R, the reflection layer 21G, and the reflection layer 21B are disposed for each pixel P0. The reflection layer 21R, the reflection layer 21G, and the reflection layer 21B are disposed to be separated away from each other. The reflection layer 21R is provided at the sub-pixel PR. The reflection layer 21R is provided between the substrate 10 and the pixel electrode 23R, and faces the pixel electrode 23R. The reflection layer 21G is provided at the sub-pixel PG. The reflection layer 21G is provided between the substrate 10 and the pixel electrode 23G, and faces the pixel electrode 23G. The reflection layer 21B is provided at the sub-pixel PB. The reflection layer 21B is provided between the substrate 10 and the pixel electrode 23B, and faces the pixel electrode 23B.

Each reflection layer 21 has light reflectivity. Examples of a material of each reflection layer 21 include metal such as aluminum and silver (Ag), or an alloy of the metal. For example, each reflection layer 21 is formed of a stacked body of an aluminum film and a titanium nitride film. A thickness of the reflection layer 21 is not particularly limited, and is equal to or greater than 100 nm, and equal to or less than 200 nm, for example.

Further, the reflection layer 21R is electrically coupled to the driving circuit 30R via a contact (not illustrated). The reflection layer 21G is electrically coupled to the driving circuit 30G via a contact (not illustrated). The reflection layer 21B is electrically coupled to the driving circuit 30B via a contact (not illustrated).

The stacked body 22 is disposed at the plurality of reflection layers 21. The stacked body 22 includes a reflection enhancing film 221, an insulating film 222, a first light-transmissive layer 224, a second light-transmissive layer 225, and a third light-transmissive layer 226. The stacked body 22 is provided for adjusting an optical distance L to be described later.

The reflection enhancing film 221 is disposed at the plurality of reflection layers 21. The reflection enhancing film 221 is provided to enhance the light reflectivity of the reflection layer 21. The reflection enhancing film 221 has optical transparency and an insulating property. The reflection enhancing film 221 contains, for example, silicon oxide (SiOx). A thickness of the reflection enhancing film 221 is, for example, equal to or greater than 20 nm, and equal to or less than 50 nm.

The insulating film 222 is disposed at the reflection enhancing film 221. The insulating film 222 separates and insulates the plurality of reflection layers 21 from each other. Note that the insulating film 222 divides the reflection layer 21 for each sub-pixel P. In addition, the insulating film 222 has a concave portion 222*a* disposed between the two adjacent reflection layers 21. An inside of the concave portion 222*a* is filled with an embedded portion 223. The insulating film 222 and the embedded portion 223 contain, for example, silicon nitride. A thickness of the insulating film 222 is, for example, equal to or greater than 20 nm, and equal to or less than 50 nm.

The first light-transmissive layer 224, the second light-transmissive layer 225, and the third light-transmissive 226 are stacked at the insulating film 222. The first light-transmissive layer 224, the second light-transmissive layer 225, and the third light-transmissive layer 226 each have translucency and an insulation property, and are provided to adjust the optical distance L between each reflection layer 21 and the counter electrode 25.

The first light-transmissive layer 224 is uniformly disposed for the sub-pixels PR, PG, and PB. The second light-transmissive layer 225 is disposed for the sub-pixel PR, and is not disposed for the sub-pixels PG and PB. The third light-transmissive layer 226 is disposed for the sub-pixels PR and PG, and is not disposed at the sub-pixel PB. Examples of materials of the first light-transmissive layer 224, the second light-transmissive layer 225, and the third light-transmissive layer 226 include inorganic silicon materials such as silicon oxide and silicon nitride. A thickness of the first light-transmissive layer 224 is, for example, equal to or greater than 20 nm, and equal to or less than 50 nm. A thickness of the second light-transmissive layer 225 is, for example, equal to or greater than 30 nm, and equal to or less than 80 nm. A thickness of the third light-transmissive layer 226 is, for example, equal to or greater than 30 nm, and equal to or less than 150 nm.

Such a stacked body 22 includes an optical adjustment layer 220R, an optical adjustment layer 220G, and an optical adjustment layer 220B. The optical adjustment layer 220R is a portion of the stacked body 22 corresponding to the sub-pixel PR, and is disposed between the reflection layer 21R and the light-emitting element 20R. The optical adjustment layer 220R includes the reflection enhancing film 221, the insulating film 222, the first light-transmissive layer 224, the second light-transmissive layer 225, and the third light-transmissive layer 226. Further, the optical adjustment layer 220G is a portion of the stacked body 22 corresponding to the sub-pixel PG, and is disposed between the reflection layer 21G and the light-emitting element 20G. The optical adjustment layer 220G includes the reflection enhancing film 221, the insulating film 222, the first light-transmissive layer 224, and the third light-transmissive layer 226. Further, the optical adjustment layer 220B is a portion of the stacked body 22 corresponding to the sub-pixel PB, and is disposed between the reflection layer 21B and the light-emitting element 20B. The optical adjustment layer 220B includes the reflection enhancing film 221, the insulating film 222, and the first light-transmissive layer 224.

Respective lengths of the optical adjustment layer 220R, the optical adjustment layer 220G, and the optical adjustment layer 220B in the Z1 direction, that is, respective thicknesses are different from each other. To be specific, the optical adjustment layer 220R, the optical adjustment layer 220G, and the optical adjustment layer 220B are ordered in descending order of the thickness.

The optical adjustment layer 220R is a layer for adjusting an optical distance LR. The optical distance LR is an optical distance between the reflection layer 21R and the counter electrode 25. In detail, the optical distance LR is an optical distance between a surface of the reflection layer 21R facing the pixel electrode 23R and a surface of the counter electrode 25 opposite to the pixel electrode 23R. The optical adjustment layer 220G is a layer for adjusting an optical distance LG. The optical distance LG is an optical distance between the reflection layer 21G and the counter electrode 25. In detail, the optical distance LG is an optical distance between a surface of the reflection layer 21G facing the pixel electrode 23G and a surface of the counter electrode 25 opposite to the pixel electrode 23G. The optical adjustment layer 220B is a layer for adjusting an optical distance LB. The optical distance LB is an optical distance between the reflection layer 21B and the counter electrode 25. In detail, the optical distance LB is an optical distance between a surface of the reflection layer 21B facing the pixel electrode 23B and a surface of the counter electrode 25 opposite to the pixel electrode 23B.

Additionally, the stacked body 22 is provided with contact electrodes 28R, 28G, and 28B. Each of the contact electrodes 28R, 28G, and 28B is a trench-type electrode provided along an inner wall surface of a contact hole penetrating the reflection enhancing film 221, the insulating film 222, and the first light-transmissive layer 224. The contact electrode 28R electrically couples the reflection layer 21R and the pixel electrode 23R. The contact electrode 28G electrically couples the reflection layer 21G and the pixel electrode 23G. The contact electrode 28B electrically couples the reflection layer 21B and the pixel electrode 23B.

Note that an insulating protective film 280 is disposed between the contact electrode 28 and the first light-transmissive layer 224. Examples of a material of the protective film 280 include an inorganic silicon material such as silicon oxide. Examples of a material of the contact electrode 28 include metal such as tungsten (W), titanium (Ti), chromium (Cr), iron (Fe), and aluminum, metal nitrides and metal silicides. Further, for the contact electrode 28, a pillar-shaped contact plug may be used instead of the trench-type electrode.

The plurality of pixel electrodes 23 are disposed at the stacked body 22. The pixel electrodes 23R, 23G, and 23B are provided for each pixel P0. Each pixel electrode 23 overlaps the corresponding reflection layer 21 in plan view. Each pixel electrode 23 has optical transparency and conductivity. Examples of a material of the pixel electrode 23 include transparent conductive materials such as indium tin oxide (ITO) and indium zinc oxide (IZO).

The element separation layer 27 including a plurality of openings is disposed at the stacked body 22. The element separation layer 27 covers an outer edge of each of the plurality of pixel electrodes 23. The plurality of pixel electrodes 23 are insulated from each other by the element separation layer 27. The plurality of light-emitting regions A are defined by the plurality of openings included in the element separation layer 27. Further, the light-emitting region A can also be defined as a region where the organic layer 24 and the pixel electrode 23 are in contact with each other. Examples of a material of the element separation layer 27 include silicon-based inorganic materials such as silicon oxide and silicon nitride. A thickness of the element separation layer 27 is, for example, equal to or greater than 10 nm, and equal to or less than 40 nm.

The organic layer 24 is disposed at the plurality of pixel electrodes 23. The organic layer 24 contains an organic light-emitting material. The organic layer 24 includes a different light emission function layer 200 for each emission color. To be specific, the organic layer 24 includes the light emission function layer 200R corresponding to the sub-pixel PR, the light emission function layer 200G corresponding to the sub-pixel PG, and the light emission function layer 200B corresponding to the sub-pixel PB. Further, although details will be described later, the light emission function layers 200 are provided with different light-emitting layers 244 for the respective emission colors.

The counter electrode 25 is disposed at the organic layer 24. The counter electrode 25 is disposed between the organic layer 24 and the colored layer 5. The counter electrode 25 is a semi-transmissive reflection film having a semi-transmissive property. Therefore, the counter electrode 25 has light reflectivity and optical transparency. Further, the counter electrode 25 has conductivity. The counter electrode 25 is formed of, for example, an alloy containing Ag such as MgAg.

Further, the pixel electrode 23R, the light emission function layer 200R, and the counter electrode 25 constitute the light-emitting element 20R. The pixel electrode 23G, the light emission function layer 200G, and the counter electrode 25 constitute the light-emitting element 20G. The pixel electrode 23B, the light emission function layer 200B, and the counter electrode 25 constitute the light-emitting element 20B.

Further, the reflection layer 21R and the counter electrode 25 constitute an optical resonant structure 29R. The optical resonant structure 29R is provided corresponding to the light-emitting element 20R. The optical resonant structure 29R causes light in the red wavelength region to be reflected multiple times between the reflection layer 21R and the counter electrode 25. Therefore, the light in the red wavelength region resonates between the reflection layer 21R and the counter electrode 25 and is emitted from the counter electrode 25.

The reflection layer 21G and the counter electrode 25 constitute an optical resonant structure 29G. The optical resonant structure 29G is provided corresponding to the light-emitting element 20G. The optical resonant structure 29G causes light in the green wavelength region to be reflected multiple times between the reflection layer 21G and the counter electrode 25. Therefore, the light in the green wavelength region resonates between the reflection layer 21G and the counter electrode 25 and is emitted from the counter electrode 25.

The reflection layer 21B and the counter electrode 25 constitute an optical resonant structure 29B. The optical resonant structure 29B is provided corresponding to the light-emitting element 20B. The optical resonant structure 29B causes light in the blue wavelength region to be reflected multiple times between the reflection layer 21B and the counter electrode 25. Therefore, the light in the blue wavelength region resonates between the reflection layer 21B and the counter electrode 25 and is emitted from the counter electrode 25.

When respective resonant wavelengths of the optical resonant structures 29R, 29G, and 29B are λ0, the following relational equation [1] is established. Note that Φ (radian) in the relational equation [1] represents a total sum of phase shifts generated at the time of transmission and reflection between the reflection layer 21R, 21G, or 21B and the counter electrode 25.

$$\{(2\times L0)/\lambda 0+\Phi\}/(2\pi)=m0(m0\text{ is an integer}) \quad [1]$$

The optical distances LR, LG, and LB are set such that a peak wavelength of light in a predetermined wavelength region is the wavelength λ0. The light in the predetermined wavelength region is enhanced by the setting, and the light can be increased in intensity, and a spectrum of the light can be narrowed.

The sealing layer 26 having optical transparency is disposed at the counter electrode 25. The sealing layer 26 protects the plurality of light-emitting elements 20. The sealing layer 26 has a gas barrier property and protects, for example, each part of lower layers from external moisture, oxygen, or the like. Since the sealing layer 26 is provided, deterioration of the light-emitting element 20 can be prevented as compared to a case where the sealing layer 26 is not provided. Therefore, quality and reliability of the electro-optical device 100 can be increased. The sealing layer 26 contains, for example, inorganic materials such as silicon oxynitride (SiON), silicon nitride (SiN), and aluminum oxide ($Al_2O_3$), or a resin material such as an epoxy resin, and is formed of a single layer or a plurality of layers.

The colored layer 5 is disposed at the sealing layer 26. The colored layer 5 is a color filter that selectively transmits light in a predetermined wavelength region. The predetermined wavelength region includes the peak wavelength λ0 for each emission color. The colored layer 5 includes a colored portion 51R, a colored portion 51G, and a colored portion 51B. The colored portion 51R is provided corresponding to the sub-pixel PR, and selectively transmits the light in the red wavelength region. The colored portion 51G is provided corresponding to the sub-pixel PG, and selectively transmits the light in the green wavelength region. The colored portion 51B is provided corresponding to the sub-pixel PB, and selectively transmits the light in the blue wavelength region. Since such a colored layer 5 is provided, color purity of light emitted from each sub-pixel P can be improved as compared to a case where the colored layer 5 is not provided. The colored layer 5 is formed of, for example, a resin material such as an acrylic photosensitive resin material containing a coloring material. The coloring material is a pigment or a dye.

The transmissive substrate 9 is bonded at the element substrate 1 described above via the adhesive layer 90. The adhesive layer 90 is, for example, a transparent adhesive in which resin materials such as an epoxy resin and an acrylic resin are used. The transmissive substrate 9 is a cover for protecting the element substrate 1. The transmissive substrate 9 is formed of, for example, a glass substrate or a quartz substrate.

1E. Organic Layer 24

Figure 5:
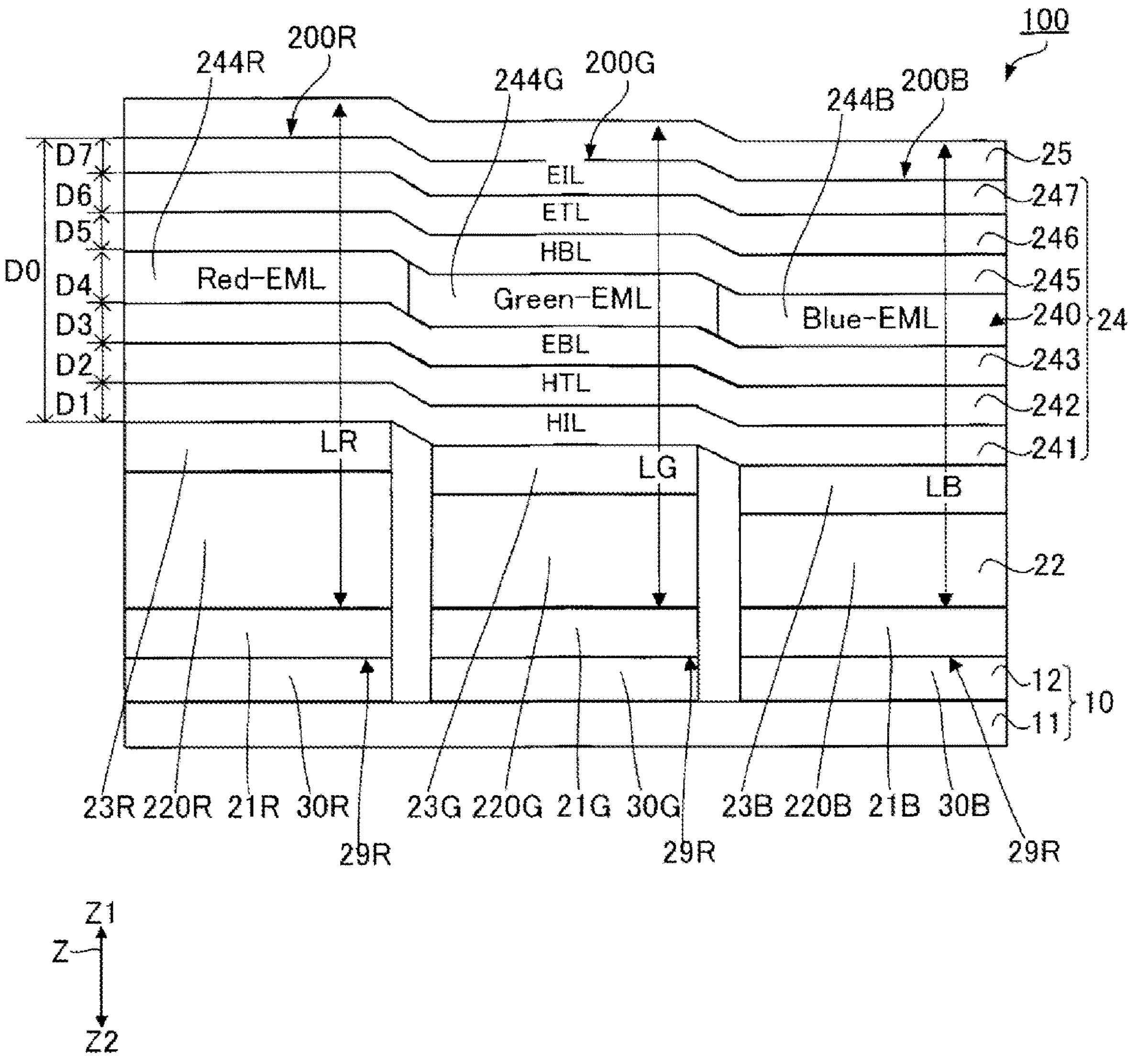
FIG. 5 is a schematic diagram of the electro-optical device illustrated in FIG. 4.

FIG. 5 is a schematic diagram of the electro-optical device 100 illustrated in FIG. 4. As described above, as illustrated in FIG. 5, the organic layer 24 includes a hole injection layer 241, a hole transport layer 242, an electron blocking layer 243, a light-emitting portion 240, a hole blocking layer 245, an electron transport layer 246, and an electron injection layer 247. The hole injection layer 241, the hole transport layer 242, the electron blocking layer 243, the light-emitting portion 240, the hole blocking layer 245, the electron transport layer 246, and the electron injection layer 247 are stacked in this order.

The hole injection layer 241 is abbreviated as HIL. The hole transport layer 242 is abbreviated as HTL. The electron blocking layer 243 is abbreviated as EBL. The light-emitting layer 244 is abbreviated as EML. The hole blocking layer is abbreviated as HBL. The electron transport layer 246 is abbreviated as ETL. The electron injection layer 247 is abbreviated as EIL. Note that each layer other than the light-emitting portion 240 may be omitted as appropriate. Further, layers other than the layers illustrated in FIG. 5 may be provided.

The hole injection layer 241 is a layer in contact with each pixel electrode 23 which is the anode, that causes holes to be injected from each pixel electrode 23. The hole transport layer 242 is a layer for transporting holes to the light-emitting portion 240. The electron blocking layer 243 is a layer for transporting holes, that blocks movement of excitons generated in the light-emitting layer 244, and electrons. Further, the electron injection layer 247 is a layer in contact with the counter electrode 25 which is the cathode, that causes electrons to be injected from the counter electrode 25. The electron transport layer 246 is a layer for transporting electrons to the light-emitting portion 240. The hole blocking layer 245 is a layer for transporting electrons, that blocks movement of holes and excitons. Known materials can be used for materials of each layer.

The light-emitting portion 240 includes the different light-emitting layers 244 for the respective emission colors, and is separately coated for each emission color. To be specific, the light-emitting portion 240 includes the light-emitting layer 244R, the light-emitting layer 244G, and the light-emitting layer 244B. The light-emitting layer 244R emits light in the red wavelength region. The light-emitting layer 244G emits light in the green wavelength region. The light-emitting layer 244B emits light in the blue wavelength region. In each light-emitting layer 244, holes and electrons are recombined, excitons are generated by energy released at the time of the recombination, and fluorescence or phosphorescence is emitted when the excitons return to a ground state. In other words, the light-emitting element 20R emits the light in the red wavelength region, the light-emitting element 20G emits the light in the green wavelength region, and the light-emitting element 20B emits the light in the blue wavelength region.

Further, the light-emitting layer 244 contains, for example, a host material and an organic light-emitting material as a dopant material corresponding to the color. The organic light-emitting material is a phosphorescent material or a fluorescent material. The light-emitting layer 244R contains a dopant material corresponding to the red wavelength region, and the dopant material may be a phosphorescent material from the viewpoint of luminance efficiency. The light-emitting layer 244G contains a dopant material corresponding to the green wavelength region, and the dopant material may be a phosphorescent material from the viewpoint of luminance efficiency. The light-emitting layer 244B contains a dopant material corresponding to the blue wavelength region. The dopant material may be phosphorescent from the viewpoint of luminance efficiency, but may be fluorescent from the viewpoint of expanding the choice of materials. Note that each of the light-emitting layers 244R and 244G may also contain a fluorescent material.

As described above, such an organic layer 24 includes the light emission function layer 200R, the light emission function layer 200G, and the light emission function layer 200B. The light emission function layer 200R is disposed between the pixel electrode 23R and the counter electrode 25 and is in contact with the pixel electrode 23R and the counter electrode 25. The light emission function layer 200G is disposed between the pixel electrode 23G and the counter electrode 25 and is in contact with the pixel electrode 23G and the counter electrode 25. The light emission function layer 200B is disposed between the pixel electrode 23B and the counter electrode 25 and is in contact with the pixel electrode 23B and the counter electrode 25.

Further, the light emission function layer 200R includes the light-emitting layer 244R described above. The light emission function layer 200G includes the light-emitting layer 244G. The light emission function layer 200B includes the light-emitting layer 244B. Thus, the light-emitting elements 20R, 20G, and 20B include the light-emitting layers 244 different from each other. Then, the material forming the light-emitting layer 244R, the material forming the light-emitting layer 244G, and the material forming the light-emitting layer 244B are different from each other. Therefore, in the embodiment, the material of the light-emitting layer 244 is different for each light-emitting element 20.

Since the material of the light-emitting layer 244 is different for each light-emitting element 20, extraction efficiency of light for each emission color can be increased, as compared to a case where the material of the light-emitting layer 244 is common. That is, in the embodiment, since each of the light-emitting layers 244R, 244G, and 244B emits light of a corresponding color, it is possible to reduce generation of unused light, as compared to an existing configuration in which a light-emitting layer that achieves white light emission is provided in common to the plurality of light-emitting elements 20.

Additionally, as described above, the optical resonant structure 29R is provided corresponding to the light-emitting element 20R. The optical resonant structure 29G is provided corresponding to the light-emitting element 20G. The optical resonant structure 29B is provided corresponding to the light-emitting element 20B. Therefore, the optical resonant structure 29 is provided for each light-emitting element 20.

Since the optical resonant structure 29 is provided for each light-emitting element 20, it is possible to improve color purity by increasing intensity of the light and narrowing a spectrum. Therefore, since the light-emitting layer 244 is provided for each light-emitting element 20 and the optical resonant structure 29 is provided corresponding to each light-emitting element 20, it is possible to provide the electro-optical device 100 having very high efficiency and high color purity.

In addition, as described above, since the light-emitting layers 244 are separately coated for the respective emission colors, the light-emitting layer 244 that emits a predetermined color does not overlap the light-emitting layer 244 for a color other than the predetermined color in plan view. Specifically, the light-emitting layer 244B does not overlap the light-emitting regions AG and AR in plan view. The light-emitting layer 244G does not overlap the light-emitting regions AB and AR in plan view. The light-emitting layer 244R does not overlap the light-emitting regions AB and AG in plan view. Since the light-emitting layer 244 that emits the predetermined color does not overlap the light-emitting layer 244 that emits a color other than the predetermined color in plan view, it is possible to avoid defects such as light emission of an unintended color or the like.

Additionally, as described above, each of the hole injection layer 241, the hole transport layer 242, the electron blocking layer 243, the hole blocking layer 245, the electron transport layer 246, and the electron injection layer 247 is common to the light-emitting elements 20R, 20G, and 20B. That is, the layers included in the organic layer 24 other than the light-emitting unit 240 are common to the light-emitting elements 20R, 20G, and 20B.

The organic layer 24 is formed by, for example, a printing method such as an ink jet method, or a vapor deposition method in which a mask is used. In particular, it is very difficult to perform coating separately for each color by the vapor deposition method. This is because not only processing accuracy of the mask itself, but also alignment accuracy between a vapor deposition mask and elements at layers lower than the organic layer 24 in a vacuum is difficult to achieve. Further, when the electro-optical device 100 is used as a micro display, an area of the light-emitting region A is very small. Therefore, it is very difficult to perform coating separately for each emission color.

In addition, it is necessary to sufficiently ensure the distance L0 between the light-emitting regions A while ensuring a plane area of the light-emitting region A. When the distance L0 is not sufficiently ensured, there is a fear that display of an image is blurred or obscured. In particular, since the sub-pixels P are arrayed at a high density in the micro display, it is difficult to sufficiently ensure the distance L0. If priority is given to the planar area of the light-emitting region A and the distance L0 is made too small, a luminance and a lifetime of the electro-optical device 100 are affected. Therefore, when the organic layer 24 is formed by the vapor deposition method, it is desirable that the number of times of separate coating is small. As the number of times of separate coating increases, a probability that a position of a deposited film comes off from a target position increases accordingly. For this reason, when characteristic variations and a yield are taken into consideration, the number of times of separate coating is desirably as small as possible.

Therefore, since the layers included in the organic layer 24 other than the light-emitting portion 240 are common to the light-emitting elements 20R, 20G, and 20B, the layers other than the light-emitting portion 240 do not need to be separately coated. Therefore, it is possible to suppress characteristic variations and a decrease in yield. Therefore, reliability of the electro-optical device 100 can be increased.

Figure 6:
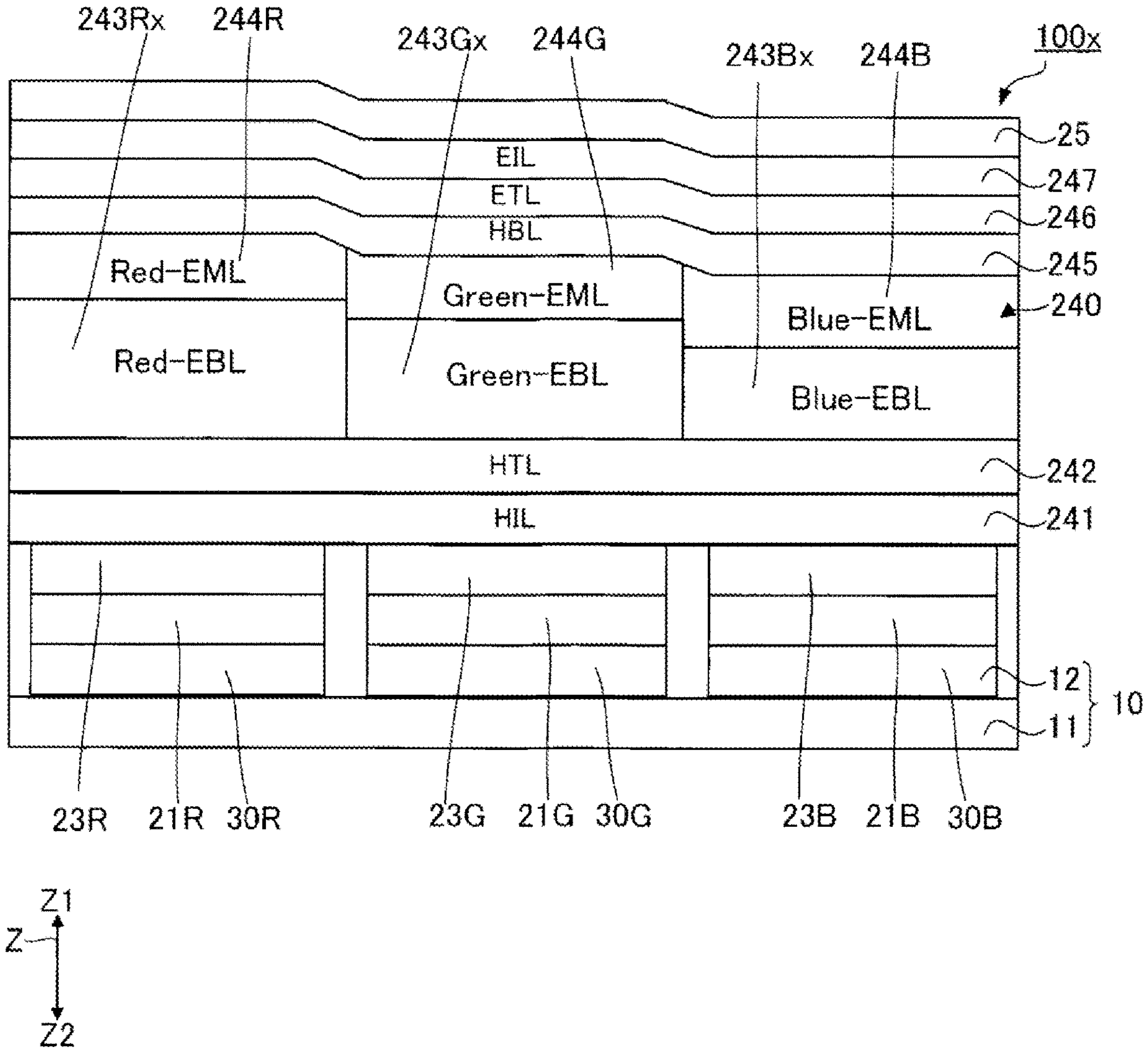
FIG. 6 is a schematic diagram of an electro-optical device of a comparative example.

FIG. 6 is a view illustrating an electro-optical device 100*x* of a comparative example. The electro-optical device 100*x* of the comparative example illustrated in FIG. 6 includes electron blocking layers 243Rx, 243Gx, and 243Bx, and the electron blocking layers 243 are separately coated for the respective emission colors. Thus, in the case of the comparative example, the layer other than the light-emitting portion 240, in addition to the light-emitting portion 240, is separately coated. It is very difficult to separately coat the layer other than the light-emitting portion 240 in addition to the light-emitting portion 240, as compared to a case where only the light-emitting portion 240 is separately coated.

When only the light-emitting portion 240 is separately coated for each emission color, it is sufficient to perform coating separately three times for each pixel P0. On the other hand, for example, when the electron blocking layer 243 and the light-emitting portion 240 are separately coated for each emission color, it is necessary to perform coating separately six times for each pixel P0. Therefore, as in the embodiment, since the layers other than the light-emitting portion 240 included in the organic layer 24 are common to the light-emitting elements 20R, 20G, and 20B, it is possible to provide the electro-optical device 100 having high definition and high color purities.

In addition, in the case of the comparative example, the stacked body 22 including the optical adjustment layer 220 is omitted. In the case of the comparative example, the optical distance L can be adjusted without providing the optical adjustment layer 220, by separately coating the electron blocking layer 243 to vary the thickness for each emission color. When the optical distance L is adjusted using the electron blocking layer 243, the thickness of the organic layer 24 is likely to be large, as compared to the case where the optical distance L is adjusted by providing the optical adjustment layer 220. Therefore, a driving voltage becomes high. Therefore, it is not particularly suitable when the electro-optical device 100 is used as a micro display.

For example, the driving transistor 32 for driving each sub-pixel P of the micro display has a lower withstand voltage than that of a large-sized display. In a case of a high pixel density of several thousand ppi, only a voltage of about several volts can be used for each driving circuit 30.

Therefore, a driving voltage of the light-emitting element 20 may be low. When a voltage for applying the same level of current is low, the electro-optical device 100 can emit light with a higher luminance, and power consumption of the entire electro-optical device 100 can be suppressed by using the driving transistor 32 having a low withstand voltage.

Further, the thicknesses of the layers of the organic layer 24 are not particularly limited. However, a thickness D3 of the electron blocking layer 243 may be smaller than a thickness D4 of each light-emitting layer 244. Since the thickness D3 is smaller than the thickness D4, it is possible to reduce the driving voltage of each light-emitting element 20, as compared to the case where the thickness is larger. In addition, in the embodiment, since the optical adjustment layer 220 is provided, it is not necessary to perform coating separately for the electron blocking layer 243 in order to adjust the optical distance L as in the case of the comparative example. Therefore, even when the thickness D3 is smaller than the thickness D4, the function of the electron blocking layer 243 can be sufficiently exhibited.

Similarly, a thickness D5 of the hole blocking layer 245 may be smaller than the thickness D4 of each light-emitting layer 244. Since the thickness D5 is smaller than the thickness D4, it is possible to reduce the driving voltage of the light-emitting elements 20 while sufficiently exhibiting the function of the hole blocking layer 245 as compared to a case where the thickness is larger.

A thickness D1 of the hole injection layer 241 is not particularly limited, but is equal to or greater than 5 nm, equal to or less than 15 nm, for example. A thickness D2 of the hole transport layer 242 is not particularly limited, but is equal to or greater than 20 nm, and equal to or less than 50 nm, for example. The thickness D3 of the electron blocking layer 243 is not particularly limited, but is equal to or greater than 5 nm, and equal to or less than 15 nm, for example. The thickness D5 of the hole blocking layer 245 is not particularly limited, but is equal to or greater than 5 nm, equal to or less than 15 nm, for example. A thickness D6 of the electron transport layer 246 is not particularly limited, but is equal to or greater than 20 nm, and equal to or less than 50 nm, for example. A thickness D7 of the electron injection layer 247 is not particularly limited, but is equal to or greater than 0.5 nm, and equal to or less than 15 nm, for example. The thickness D4 of each of the light-emitting layers 244R, 244G, and 244B is not particularly limited, but is equal to or greater than 20 nm, and equal to or less than 50 nm, for example.

The thicknesses D4 of the light-emitting layers 244R, 244G, and 244B may be different from each other, but may be equal to each other. When the thicknesses D4 of the light-emitting layers 244R, 244G, and 244B are equal to each other, it is easy to perform coating separately as compared to a case where the thicknesses are different from each other.

Further, the thicknesses DO of the light emission function layers 200R, 200G, and 200B are not particularly limited, but may be equal to or greater than 80 nm, and equal to or less than 150 nm. When the thicknesses DO are within the range, a driving voltage can be reduced and a fear of leakage due to foreign materials such as particles can be suppressed as compared to a case where the thicknesses are outside the range. In addition, in order for the effect to be remarkably exhibited, the thicknesses DO are desirably equal to or greater than 90 nm, and equal to or less than 140 nm, and more desirably equal to or greater than 100 nm, and equal to or less than 130 nm.

When the thickness DO is too large, the driving voltage becomes high, which may make it difficult to use the electro-optical device 100 as the micro display. Further, when the thickness DO is too small, there is a fear that leakage easily occurs due to foreign materials such as particles.

As described above, the electro-optical device 100 of the embodiment can be suitably used as the micro display. Therefore, the distance L0 illustrated in FIG. 3 is not particularly limited, but can be set to be equal to or less than 3 μm, for example. It is effective to use the electro-optical device 100 of the embodiment as the micro display having the distance L0 equal to or less than 3 μm. Further, the pitch L1 is not particularly limited, but can be set to be equal to or less than 10 μm. When the pitch L1 is equal to or less than 10 μm, which is very small, it is particularly effective to use the electro-optical device 100 of the embodiment.

Further, each of the electron blocking layer 243 and the hole blocking layer 245 has a role of preventing excitons generated in each light-emitting layer 244 from escaping to an outside of the light-emitting layer 244. Therefore, each of the electron blocking layer 243 and the hole blocking layer 245 may have an excitation level equal to or higher than that of a host material or a dopant material contained in the light-emitting layer 244.

When each light-emitting layer 244 emits phosphorescence, respective lowest triplet excited levels of the electron blocking layer 243 and the hole blocking layer 245 may be 2.7 eV or higher. When the levels are equal to or greater than the numerical value, it is possible to effectively prevent excitons generated in each light-emitting layer 244 from escaping to the outside, as compared with a case where the levels are less than the numerical value. For this reason, luminance efficiency of each light-emitting element 20 can be increased.

When the light-emitting layers 244R and 244G emit phosphorescence, and the light-emitting layer 244B emits fluorescence, the respective lowest triplet excited levels of the electron blocking layer 243 and the hole blocking layer 245 may be 2.5 eV or higher. When the levels are equal to or greater than the numerical value, it is possible to effectively prevent excitons generated in each light-emitting layer 244 from escaping to the outside, as compared with a case where the levels are less than the numerical value. For this reason, luminance efficiency of each light-emitting element 20 can be increased.

2. Modification Examples

The embodiment described above may be modified in various manners. Aspects of specific modifications applicable to the above-described embodiment are described below.

In the above-described embodiment, one pixel P0 includes the sub-pixels PR, PG, and PB. However, one pixel P0 may include any two of the sub-pixels PR, PG, and PB, and the remaining one may be omitted.

Further, for example, unless otherwise specified, one of the pixel electrodes 23B, 23G, and 23G corresponds to a "first pixel electrode", another corresponds to a "second pixel electrode", and the remaining one corresponds to a "third pixel electrode". In addition, the light-emitting layer 244 of an emission color corresponding to the "first pixel electrode" corresponds to a "first light-emitting layer", the light-emitting layer 244 of an emission color corresponding to the "second pixel electrode" corresponds to a "second light-emitting layer", and the light-emitting layer 244 of an emission color corresponding to the "third pixel electrode" corresponds to a "third light-emitting layer". Note that the same applies to the "first light emission function layer", the "second light emission function layer", the "third light emission function layer", the "first light-emitting element", the "second light-emitting element", the "third light-emitting element", the "first reflection layer", the "second reflection layer", the "third reflection layer", the "first optical distance", the "second optical distance", a "third optical distance", the "first optical adjustment layer", the "second optical adjustment layer", the "third optical adjustment layer", the "first light-emitting region", the "second light-emitting region", and the "third light-emitting region".

Further, the array of the sub-pixels P is not limited to the stripe array, and may be other arrays such as a Bayer array, a rectangle array, or a delta array.

3. Electronic Apparatus

The electro-optical device 100 of the above-described embodiment is applicable to various electronic apparatuses.

3-1. Head-Mounted Display

FIG. 10 is a plan view schematically illustrating a part of a virtual image electro-optical device 700 as an example of an electronic apparatus. The virtual image electro-optical device 700 illustrated in FIG. 10 is a head-mounted display (HMD) worn on a head of an observer to display images. The virtual image electro-optical device 700 includes the electro-optical device 100 described above, a collimator 71, a light guide 72, a first reflection-type volume hologram 73, a second reflection-type volume hologram 74, and a control unit 79. Note that light emitted from the electro-optical device 100 is emitted as image light LL.

The control unit 79 includes a processor and a memory, and controls operation of the electro-optical device 100, for example. The collimator 71 is disposed between the electro-optical device 100 and the light guide 72. The collimator 71 collimates the light emitted from the electro-optical device 100. The collimator 71 is constituted by a collimating lens or the like. The light collimated by the collimator 71 is incident on the light guide 72.

The light guide 72 has a flat plate shape and is disposed extending in a direction intersecting a direction of the light incident via the collimator 71. The light guide 72 reflects and guides the light therein. A light incident port on which light is incident and a light emission port from which light is emitted are provided at a surface 721 of the light guide 72 facing the collimator 71. The first reflection-type volume hologram 73 as a diffractive optical element and the second reflection-type volume hologram 74 as a diffractive optical element are disposed at a surface 722 of the light guide 72 opposite to the surface 721. The first reflection-type volume hologram 73 is provided closer to the light emission port side than the second reflection-type volume hologram 74. The first reflection-type volume hologram 73 and the second reflection-type volume hologram 74 have interference fringes corresponding to a predetermined wavelength region, and diffract and reflect light in the predetermined wavelength region.

In the virtual image electro-optical device 700 having such a configuration, the image light LL incident on the light guide 72 through the light incident port travels while being repeatedly reflected, and is guided from the light emission port to an eye EY of the observer, and thus the observer can observe an image formed as a virtual image formed by the image light LL.

The virtual image electro-optical device 700 includes the above-described electro-optical device 100. The above-described electro-optical device 100 has very high efficiency and high color purity. Therefore, since the electro-optical device 100 is included, the virtual image electro-optical device 700 with high display quality can be provided.

Note that the virtual image electro-optical device 700 may include a synthetic element such as a dichroic prism configured to synthesize light emitted from the electro-optical device 100. In this case, the virtual image electro-optical 700 may include, for example, the electro-optical device 100 configured to emit light in the blue wavelength region, the electro-optical device 100 configured to emit light in the green wavelength region, and the electro-optical device 100 configured to emit light in the red wavelength region.

3-2. Personal Computer

Figure 8:
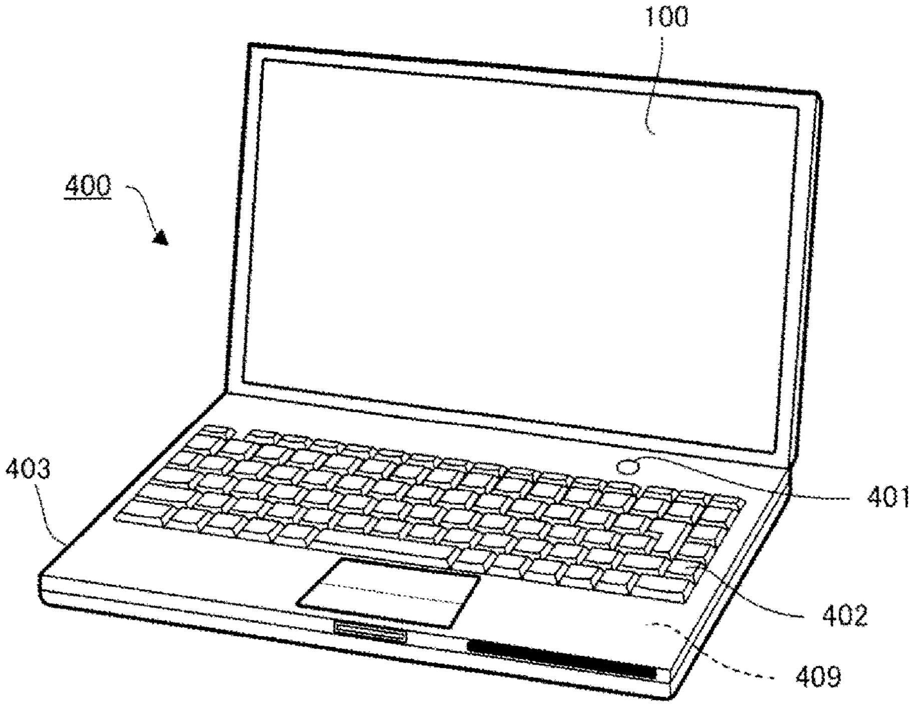
FIG. 8 is a perspective view illustrating a personal computer as an example of an electronic apparatus.

FIG. 8 is a perspective view illustrating a personal computer 400 as an example of the electronic apparatus according to the present disclosure. The personal computer 400 illustrated in FIG. 8 includes the electro-optical device 100, a main body 403 provided with a power switch 401 and a keyboard 402, and a control unit 409. The control unit 409 includes a processor and a memory, and controls operation of the electro-optical device 100, for example. The personal computer 400 includes the above-described electro-optical device 100, and thus has excellent quality.

Figure 7:
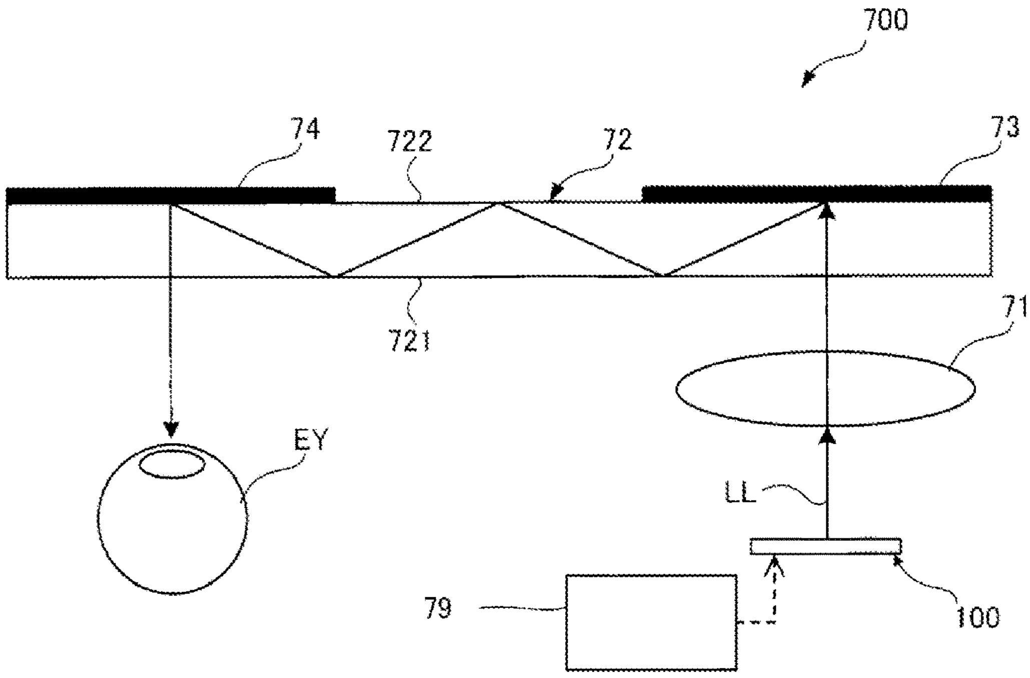
FIG. 7 is a plan view schematically illustrating a part of a virtual image electro-optical device as an example of an electronic apparatus.

Note that examples of the "electronic apparatus" including the electro-optical device 100 include, in addition to the virtual image electro-optical device 700 illustrated in FIG. 7 and the personal computer 400 illustrated in FIG. 8, apparatuses disposed close to eyes such as a digital scope, a digital binocular, a digital still camera, and a video camera. Further, the "electronic apparatus" including the electro-optical device 100 is applied as a mobile phone, a smartphone, a personal digital assistant (PDA), a car navigation device, and a vehicle-mounted display unit. Furthermore, the "electronic apparatus" including the electro-optical device 100 is applied as an illumination for illuminating light. In addition, the electro-optical device 100 can be used as, for example, a flexible display.

The present disclosure was described above based on the illustrated embodiment. However, the present disclosure is not limited thereto. In addition, the configuration of each part of the present disclosure may be replaced with any configuration that exhibits the same function as in the embodiment described above, or any configuration can be added. Further, some configurations may be combined with each other in the above-described embodiment of the present disclosure.

What is claimed is:

1. An electro-optical device, comprising:

a first light-emitting element including a counter electrode having a semi-transmissive property, a first pixel electrode having translucency, and a first light emission function layer including a first light-emitting layer, disposed between the first pixel electrode and the counter electrode, and being in contact with the first pixel electrode and the counter electrode, and configured to emit light in a first wavelength region;

a second light-emitting element including the counter electrode, a second pixel electrode having translucency, and a second light emission function layer including a second light-emitting layer, disposed between the second pixel electrode and the counter electrode, and being in contact with the second pixel electrode and the counter electrode, and configured to emit light in a second wavelength region different from the first wavelength region;

a first reflection layer;

a first optical adjustment layer disposed between the first reflection layer and the first light-emitting element and configured to adjust a first optical distance between the first reflection layer and the counter electrode;

a second reflection layer; and a second optical adjustment layer having a thickness different from a thickness of the first optical adjustment layer, disposed between the second reflection layer and the second light-emitting element, and configured to adjust a second optical distance between the second reflection layer and the counter electrode, wherein the light, in the first wavelength region, emitted by the first light-emitting element resonates between the first reflection layer and the counter electrode, and is emitted from the counter electrode, the light, in the second wavelength region, emitted by the second light-emitting element resonates between the second reflection layer and the counter electrode, and is emitted from the counter electrode, and a material forming the first light-emitting layer and a material forming the second light-emitting layer are different from each other.

2. The electro-optical device according to claim 1, wherein the first light emission function layer and the second light emission function layer include a common electron blocking layer in contact with the first light-emitting layer and the second light-emitting layer.

3. The electro-optical device according to claim 2, wherein a thickness of the electron blocking layer is smaller than a thickness of each of the first light-emitting layer and the second light-emitting layer.

4. The electro-optical device according to claim 2, wherein a lowest triplet excited level of the electron blocking layer is equal to or greater than 2.7 eV, when the light in the first wavelength region is light in a blue wavelength region, and the first light-emitting layer emits phosphorescence.

5. The electro-optical device according to claim 2, wherein a lowest triplet excited level of the electron blocking layer is equal to or greater than 2.5 eV, when the light in the first wavelength region is light in a blue wavelength region, the light in the second wavelength region is light in a green wavelength region, and the first light-emitting layer emits fluorescence, and the second light-emitting layer emits phosphorescence.

6. The electro-optical device according to claim 1, wherein a thickness of each of the first light emission function layer and the second light emission function layer is equal to or greater than 80 nm, and equal to or less than 150 nm.

7. The electro-optical device according to claim 1, wherein the first light-emitting element includes a first light-emitting region through which the light in the first wavelength region is transmitted, the second light-emitting element includes a second light-emitting region through which the light in the second wavelength region is transmitted, and the first light-emitting layer does not overlap the second light-emitting region in plan view, and the second light-emitting layer does not overlap the first light-emitting region in plan view.

8. The electro-optical device according to claim 7, wherein a distance between the first light-emitting region and the second light-emitting region is equal to or less than 3 μm.

9. An electronic apparatus comprising:

the electro-optical device according to claim 1; and a control unit configured to control operation of the electro-optical device.

* * * * *